US012173219B2

(12) United States Patent
Nomura et al.

(10) Patent No.: US 12,173,219 B2
(45) Date of Patent: Dec. 24, 2024

(54) SLURRY AND POLISHING METHOD

(71) Applicant: Showa Denko Materials Co., Ltd., Tokyo (JP)

(72) Inventors: Satoyuki Nomura, Tokyo (JP); Tomohiro Iwano, Tokyo (JP); Takaaki Matsumoto, Tokyo (JP); Tomoyasu Hasegawa, Tokyo (JP); Tomomi Kukita, Tokyo (JP)

(73) Assignee: RESONAC CORPORATION, Tokyo (JP)

(*) Notice: Subject to any disclaimer, the term of this patent is extended or adjusted under 35 U.S.C. 154(b) by 722 days.

(21) Appl. No.: 17/262,646

(22) PCT Filed: Sep. 25, 2018

(86) PCT No.: PCT/JP2018/035438
§ 371 (c)(1),
(2) Date: Jan. 22, 2021

(87) PCT Pub. No.: WO2020/021729
PCT Pub. Date: Jan. 30, 2020

(65) Prior Publication Data
US 2021/0301179 A1 Sep. 30, 2021

(30) Foreign Application Priority Data
Jul. 26, 2018 (WO) .................. PCT/JP2018/028105

(51) Int. Cl.
*C09K 3/14* (2006.01)
*B24B 37/04* (2012.01)
*C01F 17/235* (2020.01)
*C09G 1/02* (2006.01)
*H01L 21/304* (2006.01)
*H01L 21/3105* (2006.01)
*H01L 21/66* (2006.01)

(52) U.S. Cl.
CPC .......... *C09K 3/1454* (2013.01); *B24B 37/042* (2013.01); *C09G 1/02* (2013.01); *C09K 3/1409* (2013.01); *H01L 21/304* (2013.01); *H01L 21/31053* (2013.01); *H01L 22/26* (2013.01); *C01F 17/235* (2020.01); *C01P 2002/85* (2013.01); *C01P 2004/64* (2013.01); *C01P 2006/40* (2013.01)

(58) Field of Classification Search
CPC ...... C09K 3/1454; C09K 3/1409; C09G 1/02; C01F 17/235; C01P 2002/85; C01P 2004/64; H01L 21/304; H01L 21/31053
See application file for complete search history.

(56) References Cited

U.S. PATENT DOCUMENTS

| | | | |
|---|---|---|---|
| 5,543,126 A | 8/1996 | Ota | |
| 5,700,180 A | 12/1997 | Sandhu et al. | |
| 6,939,211 B2 | 9/2005 | Taylor | |
| 7,112,123 B2 | 9/2006 | Fang | |
| 11,492,526 B2 | 11/2022 | Hasegawa | |
| 11,499,078 B2 | 11/2022 | Kukita | |
| 11,505,731 B2 | 11/2022 | Matsumoto | |
| 11,518,920 B2 | 12/2022 | Hasegawa | |
| 2004/0065022 A1 | 4/2004 | Machii | |
| 2004/0152309 A1 | 8/2004 | Carter | |
| 2005/0119360 A1 | 6/2005 | Kawakami | |
| 2007/0044385 A1 | 3/2007 | Yamada | |
| 2010/0081281 A1* | 4/2010 | Babu ................ | H01L 21/31053 438/693 |
| 2010/0184359 A1 | 7/2010 | Park et al. | |
| 2011/0275285 A1 | 11/2011 | Satou | |
| 2012/0100718 A1 | 4/2012 | Minami | |
| 2012/0129346 A1 | 5/2012 | Ryuzaki | |
| 2012/0299158 A1 | 11/2012 | Shinoda | |
| 2012/0329371 A1 | 12/2012 | Iwano | |
| 2013/0161285 A1 | 6/2013 | Li | |
| 2015/0140904 A1 | 5/2015 | Iwano | |
| 2015/0232704 A1 | 8/2015 | Akutsu | |
| 2015/0232705 A1 | 8/2015 | Kachi | |
| 2016/0024351 A1 | 1/2016 | Yoshida | |
| 2016/0108284 A1 | 4/2016 | Yoshizaki | |
| 2016/0137881 A1 | 5/2016 | Oota | |

(Continued)

FOREIGN PATENT DOCUMENTS

| | | |
|---|---|---|
| CN | 101649182 A | 2/2010 |
| CN | 101978018 A | 2/2011 |

(Continued)

OTHER PUBLICATIONS

"Wikipedia, "N-vinylpyrrolidone" via https://en.wikipedia.org/wiki/N-Vinylpyrrolidone", 2020, p. 1-p. 3 (cited in Office Action mailed Mar. 9, 2021 in U.S. Appl. No. 16/981,589).

"Wikipedia, "Poly(N-vinylacetamide)" via https://en.wikipedia.org/wiki/Poly(N-vinylacetamide)", 2019, p. 1-p. 2 (cited in Office Action mailed Mar. 9, 2021 in U.S. Appl. No. 16/981,589).

"Wikipedia, "Polyethylene glycol" via https://en.wikipedia.org/wiki/Polyethylene_glycol", 2021, p. 1-p. 11 (cited in Office Action mailed Mar. 9, 2021 in U.S. Appl. No. 16/981,589).

"Wikipedia, "Tartaric acid" via https://en.wikipedia.org/wiki/Tartaric_acid", 2021, p. 1-p. 9 (cited in Office Action mailed Mar. 9, 2021 in U.S. Appl. No. 16/981,589).

A. Solt, "13.1 Amino Acids," Chemistry Libre Texts, Chem.Libretext.org, 2021 (Cited in Office Action mailed May 25, 2021 in U.S. Appl. No. 16/981,573).

(Continued)

*Primary Examiner* — Pegah Parvini
(74) *Attorney, Agent, or Firm* — Fitch, Even, Tabin & Flannery LLP

(57) ABSTRACT

A slurry containing abrasive grains and a liquid medium, in which the abrasive grains include first particles and second particles in contact with the first particles, the second particles contain at least one metal compound selected from the group consisting of a metal oxide and a metal hydroxide, the metal compound contains a metal capable of taking a plurality of valences, and a ratio of the lowest valence among the plurality of valences of the metal is 0.10 or more in X-ray photoelectron spectroscopy.

21 Claims, No Drawings

(56) References Cited

U.S. PATENT DOCUMENTS

| | | |
|---|---|---|
| 2016/0272860 A1 | 9/2016 | Mizoguchi et al. |
| 2016/0319159 A1 | 11/2016 | Minami |
| 2017/0183537 A1 | 6/2017 | Yoon |
| 2017/0183538 A1 | 6/2017 | Kwon |
| 2017/0194160 A1 | 7/2017 | Pallikkara Kuttiatoor et al. |
| 2017/0292039 A1 | 10/2017 | Sato |
| 2018/0043497 A1 | 2/2018 | Hanano |
| 2018/0072917 A1 | 3/2018 | Kobayashi |
| 2019/0153264 A1 | 5/2019 | Bottiglieri et al. |
| 2019/0211245 A1 | 7/2019 | Choi |
| 2019/0256742 A1 | 8/2019 | Suzuki |
| 2020/0299544 A1 | 9/2020 | Hanano |
| 2021/0017422 A1 | 1/2021 | Iwano |
| 2021/0189175 A1 | 6/2021 | Gagliardi |

FOREIGN PATENT DOCUMENTS

| | | |
|---|---|---|
| CN | 102232242 A | 11/2011 |
| CN | 103189457 | 7/2013 |
| CN | 103222035 A | 7/2013 |
| CN | 103339219 | 10/2013 |
| CN | 104334675 | 2/2015 |
| CN | 105453235 A | 3/2016 |
| CN | 105895518 | 8/2016 |
| CN | 106471090 A | 3/2017 |
| CN | 108010878 | 5/2018 |
| JP | H08022970 | 1/1996 |
| JP | H10106994 | 4/1998 |
| JP | 2005513765 | 5/2005 |
| JP | 2006249129 | 9/2006 |
| JP | 2007318072 | 12/2007 |
| JP | 2008112990 | 5/2008 |
| JP | 2009290188 | 12/2009 |
| JP | 2010153781 | 7/2010 |
| JP | 2011-054906 A | 3/2011 |
| JP | 2011518098 | 6/2011 |
| JP | 4941430 | 5/2012 |
| JP | 2012186339 | 9/2012 |
| JP | 2013540851 | 11/2013 |
| JP | 201593932 | 5/2015 |
| JP | 2015-137297 A | 7/2015 |
| JP | 2015137297 | 7/2015 |
| JP | 2016029123 | 3/2016 |
| JP | 5943073 | 6/2016 |
| JP | 2016538359 | 12/2016 |
| JP | 201752858 | 3/2017 |
| JP | 2017-110177 A | 6/2017 |
| JP | 2017203076 | 11/2017 |
| JP | 2018044046 | 3/2018 |
| KR | 2016009150 A | 1/2016 |
| KR | 1020170004462 | 1/2017 |
| KR | 1020170032335 | 3/2017 |
| KR | 101737938 | 5/2017 |
| KR | 1020170097090 | 8/2017 |
| KR | 1020180029888 | 3/2018 |
| TW | 201518489 | 5/2015 |
| TW | 201518492 | 5/2015 |
| TW | 201525118 | 7/2015 |
| TW | 201610126 | 3/2016 |
| TW | 201816060 | 5/2018 |
| WO | 97029510 | 8/1997 |
| WO | 02067309 | 8/2002 |
| WO | 2008146641 | 12/2008 |
| WO | 2009131133 | 10/2009 |
| WO | 2010143579 | 12/2010 |
| WO | 2012070541 | 5/2012 |
| WO | 2012070542 | 5/2012 |
| WO | 2012070544 | 5/2012 |
| WO | 2013125441 | 8/2013 |
| WO | 2014199739 | 12/2014 |
| WO | 2014208414 | 12/2014 |
| WO | 2015052988 | 4/2015 |
| WO | 2015098197 | 7/2015 |
| WO | 2016006553 | 1/2016 |
| WO | 2016143797 | 9/2016 |
| WO | 201743139 | 3/2017 |
| WO | 2018012174 | 1/2018 |
| WO | 2018048068 | 3/2018 |

OTHER PUBLICATIONS

Merricks et al., "Evolution and Revolution of Cerium Oxide Slurries in CMP," Ferro Electronic Material Systems, 2015, pp. 1-6 (Cited in Office Action mailed Mar. 10, 2022 in U.S. Appl. No. 16/981,560).

"Glyceric acid," https://en.wikipedia.org/wiki/Glyceric_acid, 2021, p. 1-p. 2 (Cited in Office Action mailed May 10, 2021 in U.S. Appl. No. 16/981,589).

"Glycolic Acid," https://en.wikipedia.org/wiki/Glycolic_acid, 2021, p. 1-p. 5 (Cited in Office Action mailed May 10, 2021 in U.S. Appl. No. 16/981,589).

"Lactic acid," https://en.wikipedia.org/wiki/Lactic_acid, 2021, p. 1-p. 11 (Cited in Office Action mailed May 10, 2021 in U.S. Appl. No. 16/981,589).

Merrian Webster, Definition of "have," https://www.merriam-webster.com/dictionary/have, 2021, p. 1-p. 14 (Cited in Office Action mailed May 10, 2021 in U.S. Appl. No. 16/981,589).

International Search Report dated Dec. 11, 2018, for International Application No. PCT/JP2018/035456, together with English language translation.

Written Opinion of the International Searching Authority dated Dec. 11, 2018, for International Application No. PCT/JP2018/035456, together with English language translation.

International Search Report dated Aug. 1, 2019, for International Application No. PCT/JP2018/035441, together with English language translation.

Written Opinion of the International Searching Authority dated Aug. 1, 2019, for International Application No. PCT/JP2018/035441, together with English language translation.

International Search Report dated Dec. 25, 2018, for International Application No. PCT/JP2018/035443, together with English language translation.

Written Opinion of the International Searching Authority dated Dec. 25, 2018, for International Application No. PCT/JP2018/035443, together with English language translation.

International Search Report dated Aug. 1, 2019, for International Application No. PCT/JP2018/035463, together with English language translation.

Written Opinion of the International Searching Authority dated Aug. 1, 2019, for International Application No. PCT/JP2018/035463, together with English language translation.

International Search Report dated Sep. 24, 2019, for International Application No. PCT/JP2019/028712, together with English language translation.

Written Opinion of the International Searching Authority dated Sep. 27, 2019, for International Application No. PCT/JP2019/028712, together with English language translation.

* cited by examiner

SLURRY AND POLISHING METHOD

CROSS-REFERENCE TO RELATED APPLICATIONS

This application is a U.S. national phase application filed under 35 U.S.C. § 371 of International Application No. PCT/JP2018/035438, filed Sep. 25, 2018, designating the United States, which claims priority from International Application No. PCT/JP2018/028105, filed Jul. 26, 2018, which are hereby incorporated herein by reference in their entirety.

TECHNICAL FIELD

The present invention relates to a slurry and a polishing method.

BACKGROUND ART

In the manufacturing steps for semiconductor elements of recent years, the importance of processing technologies for density increase and micronization is increasing more and more. CMP (Chemical mechanical polishing) technology, which is one of the processing technologies, has become an essential technology for the formation of a shallow trench isolation (hereinafter, referred to as "STI"), flattening of a pre-metal insulating material or an interlayer insulating material, formation of a plug or an embedded metal wiring, and the like in the manufacturing steps for semiconductor elements.

Regarding polishing liquids that are most commonly used, for example, silica-based polishing liquids containing silica (silicon oxide) particles such as fumed silica and colloidal silica as abrasive grains are mentioned. Silica-based polishing liquids have a feature of high flexibility of use, and by appropriately selecting the content of abrasive grains, pH, additives, and the like, polishing of a wide variety of materials can be achieved regardless of whether the material is an insulating material or an electroconductive material.

Meanwhile, as a polishing liquid mainly used for insulating materials such as silicon oxide, a demand for a polishing liquid containing cerium compound particles as abrasive grains is also increasing. For example, a cerium oxide-based polishing liquid containing cerium oxide particles as abrasive grains can polish silicon oxide at a high rate even when the abrasive grain content is lower than that in the silica-based polishing liquid (for example, see Patent Literatures 1 and 2 described below).

CITATION LIST

Patent Literature

Patent Literature 1: Japanese Unexamined Patent Publication No. H10-106994
Patent Literature 2: Japanese Unexamined Patent Publication No. H08-022970

SUMMARY OF INVENTION

Technical Problem

Incidentally, in recent years, 3D-NAND devices in which the cell portions of a device are laminated in the longitudinal direction have come to the fore. In the present technology, the level differences of the insulating materials during cell formation are several times higher compared to the conventional planar types. According to this, in order to maintain the throughput of the device production, it is necessary to rapidly resolve the high level differences as described above in a CMP step or the like, and it is necessary to improve the polishing rate for an insulating material.

The present invention is directed to solve the problems described above, and an object of the present invention is to provide a slurry capable of improving the polishing rate for an insulating material, and a polishing method using the slurry.

Solution to Problem

A slurry of an aspect of the present invention contains abrasive grains and a liquid medium, in which the abrasive grains include first particles and second particles in contact with the first particles, the second particles contain at least one metal compound selected from the group consisting of a metal oxide and a metal hydroxide, the metal compound contains a metal capable of taking a plurality of valences, and a ratio of the lowest valence among the plurality of valences of the metal is 0.10 or more in X-ray photoelectron spectroscopy.

According to the slurry of an aspect of the present invention, it is possible to improve the polishing rate for an insulating material, and therefore, an insulating material can be polished at a high polishing rate.

A polishing method of another aspect of the present invention includes a step of polishing a surface to be polished by using the above-described slurry. According to such a polishing method, the above-described effects similar to those obtainable with the above-described slurry can be obtained by using the above-described slurry.

Advantageous Effects of Invention

According to the present invention, it is possible to provide a slurry capable of improving the polishing rate for an insulating material and a polishing method using the slurry.

According to the present invention, it is possible to provide use of a slurry in polishing of a surface to be polished containing an insulating material. According to the present invention, it is possible to provide use of a slurry in a flattening step of a base substrate surface that is the manufacturing technology of semiconductor elements. According to the present invention, it is possible to provide use of a slurry for a flattening step of an STI insulating material, a pre-metal insulating material, or an interlayer insulating material.

DESCRIPTION OF EMBODIMENTS

Hereinafter, embodiments of the present invention will be described in detail. However, the present invention is not limited to the following embodiments.

Definition

In the present specification, a numerical range that has been indicated by use of "to" indicates the range that includes the numerical values which are described before and after "to", as the minimum value and the maximum value, respectively. In the numerical ranges that are described stepwise in the present specification, the upper limit value or the lower limit value of the numerical range of a certain stage can be arbitrarily combined with the upper limit value or the lower limit value of the numerical range of another stage. In the numerical ranges that are described in the present specification, the upper limit value or the lower limit value of the numerical value range may be replaced with the value shown in the examples. "A or B" may include either one of A and B, and may also include both of A and B. Materials listed as examples in the present specification can be used singly or in combinations of two or more, unless otherwise specifically indicated. In the present specification, when a plurality of substances corresponding to each component exist in the composition, the content of each component in the composition means the total amount of the plurality of substances that exist in the composition, unless otherwise specified. The term "step" includes not only an independent step but also a step by which an intended action of the step is achieved, though the step cannot be clearly distinguished from other steps.

As described later, a slurry of the present embodiment contains abrasive grains. The abrasive grains are also referred to as "abrasive particles"; however, in the present specification, the term "abrasive grains" is used. Abrasive grains are generally solid particles, and it is considered that at the time of polishing, an object to be removed is removed by the mechanical action (physical action) of the abrasive grains and the chemical action of the abrasive grains (mainly the surface of the abrasive grains); however, it is not limited to this. The polishing rate in the case of using the slurry of the present embodiment can be compared, for example, on the basis of a polishing rate obtained when the content of the abrasive grains (the total amount of particles) is adjusted to 0.1% by mass on the basis of the total mass of the slurry.

In the present specification, the term "polishing liquid" (abrasive) is defined as a composition to be brought into contact with a surface to be polished, at the time of polishing. The term "polishing liquid" itself does not at all limit the components that are contained in the polishing liquid.

The weight average molecular weight in the present specification can be measured, for example, by a gel permeation chromatography method (GPC) under the following conditions using a calibration curve of standard polystyrene.

Instrument used: Hitachi L-6000 Model [manufactured by Hitachi, Ltd.]
Column: Gel-Pak GL-R420+Gel-Pak GL-R430+Gel-Pak GL-R440 [manufactured by Hitachi Chemical Co., Ltd., trade names, three columns in total]
Eluent: tetrahydrofuran
Measurement temperature: 40° ° C.
Flow rate: 1.75 mL/min
Detector: L-3300RI [manufactured by Hitachi, Ltd.]
<Slurry>

The slurry of the present embodiment contains abrasive grains and a liquid medium as essential components. The slurry of the present embodiment can be used as, for example, a polishing liquid (CMP polishing liquid).

The abrasive grains include composite particles including first particles and second particles in contact with the first particles. The second particles contain at least one metal compound selected from the group consisting of a metal oxide and a metal hydroxide, and the metal compound contains a metal capable of taking a plurality of valences (atomic valence). Furthermore, a ratio of the lowest valence among the plurality of valences of the metal is 0.10 or more in X-ray photoelectron spectroscopy (XPS).

The polishing rate for an insulating material (for example, silicon oxide) can be improved by using the slurry of the present embodiment. The reasons why the polishing rate for an insulating material is improved in this way are, for example, the reasons to be as follows while using silicon oxide as an example. However, the reasons are not limited to the reasons to be as follows.

That is, upon polishing of silicon oxide, a first stage in which the metal atom in the abrasive grains and the silicon atom of silicon oxide are bonded via the oxygen atom (for example, a stage in which a Ce—O—Si bond is generated in a case where the metal atom is cerium) and a second stage in which the bonding between the silicon atom and another oxygen atom in a surface to be polished is cleaved while maintaining the bonding of the metal atom—the oxygen atom—the silicon atom, to thereby remove the silicon atom from the surface to be polished are created. Further, when the abrasive grains are brought into contact with silicon oxide, the first stage is easy to proceed as the ratio of the lowest valence among the valences of the metal in the abrasive grains is larger, and thus polishing of silicon oxide is easy to proceed on the whole. From such a viewpoint, in a case where the ratio of the lowest valence among the plurality of valences of the metal contained in the abrasive grains is the predetermined value or more, the first stage is easy to proceed, and thus polishing of silicon oxide is easy to proceed on the whole. As described above, the polishing rate for silicon oxide is improved.

(Abrasive Grains)

As described above, the abrasive grains of the slurry of the present embodiment include composite particles including first particles and second particles in contact with the first particles. The second particles contain at least one metal compound selected from the group consisting of a metal oxide and a metal hydroxide, and the metal compound contains a metal (hereinafter, referred to as "metal M") capable of taking a plurality of valences. That is, the second particles contain at least one selected from the group consisting of an oxide containing the metal M and a hydroxide containing the metal M.

In the slurry of the present embodiment, the ratio of the lowest valence among the plurality of valences of the metal M is 0.10 or more in X-ray photoelectron spectroscopy, from the viewpoint that the polishing rate for an insulating material is improved. The ratio of the valence is the ratio in a case where the entire amount (entire atom) of the metal M is regarded as 1, and is the ratio (unit: at %) of the number of atoms having a target valence. The ratio of the valence can be measured by a method described in Examples. A peak position in an X-ray photoelectron spectroscopic spectrum varies depending on the valence due to a chemical shift. Meanwhile, the number of atoms of each peak is proportional to the area of the peak. Therefore, a ratio between the numbers of atoms having respective valences is obtained on the basis of the shape of the spectrum. As a method of adjusting the valence of the metal M, a method of subjecting abrasive grains to an oxidation treatment or a reduction treatment, and the like are exemplified. Examples of an oxidation treatment method include a method of treating abrasive grains with a reagent having oxidation action; and a method of performing a high-temperature treatment in air or under an oxygen atmosphere. Examples of a reduction treatment method include a method of treating abrasive grains with a reagent having reduction action; and a method of performing a high-temperature treatment under a reducing atmosphere such as hydrogen. The metal M may have a plurality of valences. The lowest valence may be, for example, trivalent.

The ratio of the valence is preferably 0.12 or more, more preferably 0.14 or more, further preferably 0.15 or more, and particularly preferably 0.16 or more, from the viewpoint that the polishing rate for an insulating material is further improved. The ratio of the valence is preferably 0.50 or less from the viewpoint that the polishing rate for an insulating material is further improved.

The particle size of the second particles is preferably smaller than the particle size of the first particles. The magnitude relationship in particle size between the first particles and the second particles can be determined from SEM images of the composite particles, or the like. In general, particles having a small particle size have a larger surface area per unit mass than that of particles having a large particle size, and thus have higher reaction activity. On the other hand, the mechanical action (mechanical polishing force) of particles having a small particle size is smaller than that of particles having a large particle size. However, in the present embodiment, even in a case where the particle size of the second particles is smaller than the particle size of the first particles, the synergetic effect of the first particles and the second particles can be expressed and both of excellent reaction activity and excellent mechanical action can be easily achieved.

The lower limit of the particle size of the first particles is preferably 15 nm or more, more preferably 25 nm or more, further preferably 35 nm or more, particularly preferably 40 nm or more, extremely preferably 50 nm or more, highly preferably 80 nm or more, and even more preferably 100 nm or more, from the viewpoint that the polishing rate for an insulating material is further improved. The upper limit of the particle size of the first particles is preferably 1000 nm or less, more preferably 800 nm or less, further preferably 600 nm or less, particularly preferably 400 nm or less, extremely preferably 300 nm or less, highly preferably 200 nm or less, and even more preferably 150 nm or less, from the viewpoint of improving the dispersibility of the abrasive grains and the viewpoint of easily suppressing scratches at a polished surface. From the above-described viewpoints, the particle size of the first particles is more preferably 15 to 1000 nm. The average particle size (average secondary particle size) of the first particles may be in the above ranges.

The lower limit of the particle size of the second particles is preferably 1 nm or more, more preferably 2 nm or more, and further preferably 3 nm or more, from the viewpoint that the polishing rate for an insulating material is further improved. The upper limit of the particle size of the second particles is preferably 50 nm or less, more preferably 30 nm or less, further preferably 25 nm or less, particularly preferably 20 nm or less, extremely preferably 15 nm or less, and highly preferably 10 nm or less, from the viewpoint of improving the dispersibility of the abrasive grains and the viewpoint of easily suppressing scratches at a polished surface. From the above-described viewpoints, the particle size of the second particles is more preferably 1 to 50 nm. The average particle size (average secondary particle size) of the second particles may be in the above ranges.

The average particle size (average secondary particle size) of the abrasive grains (the entire abrasive grains including composite particles and free particles) in the slurry is preferably in the following range. The lower limit of the average particle size of the abrasive grains is preferably 16 nm or more, more preferably 20 nm or more, further preferably 30 nm or more, particularly preferably 40 nm or more, extremely preferably 50 nm or more, highly preferably 100 nm or more, even more preferably 120 nm or more, and further preferably 140 nm or more, from the viewpoint that the polishing rate for an insulating material is further improved. The upper limit of the average particle size of the abrasive grains is preferably 1050 nm or less, more preferably 1000 nm or less, further preferably 800 nm or less, particularly preferably 600 nm or less, extremely preferably 500 nm or less, highly preferably 400 nm or less, even more preferably 300 nm or less, further preferably 200 nm or less, particularly preferably 160 nm or less, and extremely preferably 155 nm or less, from the viewpoint of improving the dispersibility of the abrasive grains and the viewpoint of easily suppressing scratches at a polished surface. From the above-described viewpoints, the average particle size of the abrasive grains is more preferably 16 to 1050 nm.

The average particle size can be measured, for example, using a light diffraction scattering type particle size distribution meter (for example, trade name: N5 manufactured by Beckman Coulter, Inc. or trade name: MICROTRAC MT3300EXII manufactured by MicrotracBEL Corp.).

The zeta potential of the abrasive grains (the zeta potential of the entire abrasive grains) in the slurry is preferably in the following range. The zeta potential of the abrasive grains is preferably +10 mV or more, more preferably +20 mV or more, further preferably +25 mV or more, particularly preferably +30 mV or more, extremely preferably +40 mV or more, and highly preferably +50 mV or more, from the viewpoint that the polishing rate for an insulating material is further improved. The upper limit of the zeta potential of the abrasive grains is not particularly limited, and is, for example, +200 mV or less.

The first particles can have a negative zeta potential. The second particles can have a positive zeta potential.

The zeta potential represents the surface potential of a particle. The zeta potential can be measured, for example, using a dynamic light scattering type zeta potential measuring apparatus (for example, trade name: DelsaNano C manufactured by Beckman Coulter, Inc.). The zeta potential of the particles can be adjusted using an additive. For example, by bringing monocarboxylic acid (for example, acetic acid) into contact with particles containing cerium oxide, particles having a positive zeta potential can be obtained. Furthermore, by bringing ammonium dihydrogen phosphate, a material having carboxyl group (for example, polyacrylic acid) or the like into contact with particles containing cerium oxide, particles having a negative zeta potential can be obtained.

The first particles preferably contain at least one metal (hereinafter, referred to as "metal m") selected from the group consisting of silicon (Si), vanadium (V), manganese (Mn), iron (Fe), cobalt (Co), nickel (Ni), copper (Cu), silver (Ag), indium (In), tin (Sn), a rare earth element (rare earth metal element), tungsten (W), and bismuth (Bi), from the viewpoint that the polishing rate for an insulating material is further improved. The metal m preferably contains at least one selected from the group consisting of scandium (Sc) and lanthanoid as a rare earth element, from the viewpoint that the polishing rate for an insulating material is further improved. The metal m preferably contains at least one selected from the group consisting of cerium (Ce), praseodymium (Pr), europium (Eu), terbium (Tb), and ytterbium (Yb) as lanthanoid, from the viewpoint that the polishing rate for an insulating material is further improved. The metal m preferably contains a rare earth element, more preferably contains lanthanoid, and further preferably contains cerium, from the viewpoint that the polishing rate for an insulating material is further improved.

The first particles may contain an organic compound and may contain a polymer compound (polymer). Examples of the polymer compound include polystyrene, polyphenylene sulfide, polyamide imide, an epoxy resin, polyvinylidene fluoride, polyethylene terephthalate, polybutylene telephthalate, polyester, polyethersulfone, polylactic acid, an ethylcellulose resin, and an acrylic resin.

The metal M of the second particles preferably contains a rare-earth metal, more preferably contains lanthanoid, and further preferably contains cerium, from the viewpoint that the polishing rate for an insulating material is further improved. As lanthanoid, at least one selected from the group consisting of cerium, praseodymium, europium, terbium, ytterbium, and lutetium can be used.

The second particles preferably contain a metal hydroxide and more preferably contain a hydroxide containing cerium (cerium hydroxide), from the viewpoint that the polishing rate for an insulating material is further improved. The abrasive grains containing cerium hydroxide have higher reactivity (chemical action) with an insulating material (for example, silicon oxide) by the action of the hydroxyl group than particles composed of silica, cerium oxide, or the like, and an insulating material can be polished at a higher polishing rate. The cerium hydroxide is, for example, a compound containing a cerium ion and at least one hydroxide ion ($OH^-$). The cerium hydroxide may contain an anion (for example, nitrate ion $NO_3^-$ and sulfate ion $SO_4^{2-}$) other than a hydroxide ion. For example, the cerium hydroxide may contain an anion (for example, nitrate ion $NO_3^-$ and sulfate ion $SO_4^{2-}$) bonded to a cerium ion.

The cerium hydroxide can be prepared by reacting a cerium salt with an alkali source (base). The cerium hydroxide can be prepared by mixing a cerium salt with an alkali liquid (for example, alkali aqueous solution). The cerium hydroxide can be obtained by mixing a cerium salt solution (for example, a cerium salt aqueous solution) with alkali liquid. Examples of the cerium salt include $Ce(NO_3)_4$, $Ce(SO_4)_2$, $Ce(NH_4)_2(NO_3)_6$, and $Ce(NH_4)+(SO_4)_4$.

It is considered that particles including $Ce(OH)_aX_b$ (in the formula, $a+b \times c=4$) composed of cerium ion, one to three hydroxide ions ($OH^-$), and one to three anions ($X^{c-}$) are generated (incidentally, such particles are also "cerium hydroxide") depending on production conditions of cerium hydroxide and the like. It is considered that, in $Ce(OH)_aX_b$, an electron-withdrawing anion ($X^{c-}$) acts to enhance reactivity of the hydroxide ion and the polishing rate is improved with the increase in abundance of $Ce(OH)_aX_b$. Examples of the anions ($X^{c-}$) include $NO_3-$ and $SO_4^{2-}$. It is considered that the particles containing cerium hydroxide can contain not only $Ce(OH)_aX_b$ but also $Ce(OH)+$, $CeO_2$, or the like.

The containing of $Ce(OH)_aX_b$ in the particles containing cerium hydroxide can be confirmed by a method for detecting a peak corresponding to the anions ($X^{c-}$) with FT-IR ATR method (Fourier transform Infra Red Spectrometer Attenuated Total Reflection method) after washing the particles with pure water well. The existence of the anions ($X^{c-}$) can also be confirmed by X-ray photoelectron spectroscopy.

The abrasive grains of the slurry of the present embodiment are preferably an embodiment in which the particle size of the second particles is smaller than the particle size of the first particles, the first particles contain cerium oxide, and the second particles contain at least one cerium compound selected from the group consisting of cerium oxide and cerium hydroxide, from the viewpoint that the polishing rate for an insulating material is further improved. The reasons why the polishing rate for an insulating material is improved in this way are, for example, the reasons to be as follows. However, the reasons are not limited to the reasons to be as follows.

That is, the first particles containing cerium oxide and having a larger particle size than that of the second particles have strong mechanical action (mechanical property) with respect to an insulating material as compared to the second particles. On the other hand, the second particles containing a cerium compound and having a smaller particle size than that of the first particles have small mechanical action with respect to an insulating material as compared to the first particles, but have strong chemical action (chemical property) with respect to an insulating material since the specific surface area (surface area per unit mass) in the whole particle is large. Therefore, a synergetic effect of improving the polishing rate is easily obtained by using the first particles having strong mechanical action and the second particles having strong chemical action.

The composite particles including the first particles and the second particles can be obtained by bringing the first particles and the second particles into contact with each other using a homogenizer, a nanomizer, a ball mill, a bead mill, a sonicator, or the like; by bringing the first particles and the second particles each having opposing charges to each other into contact with each other; by bringing the first particles and the second particles into contact with each other in a state of a small content of the particles; or the like.

The lower limit of the content of cerium oxide in the first particles is preferably 50% by mass or more, more preferably 70% by mass or more, further preferably 90% by mass or more, and particularly preferably 95% by mass or more, on the basis of the entire first particles (the entire first particles contained in the slurry; the same applies hereinafter), from the viewpoint that the polishing rate for an insulating material is further improved. The first particles may be an embodiment substantially composed of cerium oxide (an embodiment in which substantially 100% by mass of the first particles are cerium oxide).

The lower limit of the content of the cerium compound in the second particles is preferably 50% by mass or more, more preferably 70% by mass or more, further preferably 90% by mass or more, and particularly preferably 95% by mass or more, on the basis of the entire second particles (the entire second particles contained in the slurry; the same applies hereinafter), from the viewpoint that the polishing rate for an insulating material is further improved. The second particles may be an embodiment substantially composed of a cerium compound (an embodiment in which substantially 100% by mass of the second particles are a cerium compound).

The content of the second particles can be estimated on the basis of a value of absorbance of equation below which is obtained by a spectrophotometer when light having a specific wavelength is transmitted through the slurry. That is, in a case where particles absorb light having a specific wavelength, the light transmittance of a region containing these particles is decreased. The light transmittance is decreased not only by absorption of the particles but also by scattering, but in the second particles, the influence of scattering is small. Therefore, in the present embodiment, the content of the second particles can be estimated on the basis of a value of absorbance calculated by equation below.

$$\text{Absorbance} = -\text{LOG}_{10}(\text{Light transmittance [\%]}/100)$$

The lower limit of the content of the first particles in the abrasive grains is preferably 50% by mass or more, more preferably more than 50% by mass, further preferably 60% by mass or more, particularly preferably 70% by mass or more, extremely preferably 75% by mass or more, highly preferably 80% by mass or more, even more preferably 85% by mass or more, and further preferably 90% by mass or more, on the basis of the entire abrasive grains (the entire abrasive grains contained in the slurry; the same applies hereinafter), from the viewpoint that the polishing rate for an insulating material is further improved. The upper limit of the content of the first particles in the abrasive grains is preferably 95% by mass or less, more preferably 93% by mass or less, and further preferably 91% by mass or less, on the basis of the entire abrasive grains, from the viewpoint that the polishing rate for an insulating material is further improved. From the above-described viewpoints, the content of the first particles in the abrasive grains is more preferably 50 to 95% by mass on the basis of the entire abrasive grains.

The lower limit of the content of the second particles in the abrasive grains is preferably 5% by mass or more, more preferably 7% by mass or more, and further preferably 9% by mass or more, on the basis of the entire abrasive grains (the entire abrasive grains contained in the slurry), from the viewpoint that the polishing rate for an insulating material is further improved. The upper limit of the content of the second particles in the abrasive grains is preferably 50% by mass or less, more preferably less than 50% by mass, further preferably 40% by mass or less, particularly preferably 30% by mass or less, extremely preferably 20% by mass or less, and highly preferably 10% by mass or less, on the basis of the entire abrasive grains, from the viewpoint that the polishing rate for an insulating material is further improved. From the above-described viewpoints, the content of the second particles in the abrasive grains is more preferably 5 to 50% by mass on the basis of the entire abrasive grains.

The lower limit of the content of cerium oxide in the abrasive grains is preferably 50% by mass or more, more preferably more than 50% by mass, further preferably 60% by mass or more, particularly preferably 70% by mass or more, extremely preferably 75% by mass or more, highly preferably 80% by mass or more, even more preferably 85% by mass or more, and further preferably 90% by mass or more, on the basis of the entire abrasive grains (the entire abrasive grains contained in the slurry), from the viewpoint that the polishing rate for an insulating material is further improved. The upper limit of the content of cerium oxide in the abrasive grains is preferably 95% by mass or less, more preferably 93% by mass or less, and further preferably 91% by mass or less, on the basis of the entire abrasive grains, from the viewpoint that the polishing rate for an insulating material is further improved. From the above-described viewpoints, the content of cerium oxide in the abrasive grains is more preferably 50 to 95% by mass on the basis of the entire abrasive grains.

The lower limit of the content of cerium hydroxide in the abrasive grains is preferably 5% by mass or more, more preferably 7% by mass or more, and further preferably 9% by mass or more, on the basis of the entire abrasive grains (the entire abrasive grains contained in the slurry), from the viewpoint that the polishing rate for an insulating material is further improved. The upper limit of the content of cerium hydroxide in the abrasive grains is preferably 50% by mass or less, more preferably less than 50% by mass, further preferably 40% by mass or less, particularly preferably 30% by mass or less, extremely preferably 20% by mass or less, and highly preferably 10% by mass or less, on the basis of the entire abrasive grains, from the viewpoint that the polishing rate for an insulating material is further improved. From the above-described viewpoints, the content of cerium hydroxide in the abrasive grains is more preferably 5 to 50% by mass on the basis of the entire abrasive grains.

The lower limit of the content of the first particles is preferably 50% by mass or more, more preferably more than 50% by mass, further preferably 60% by mass or more, particularly preferably 70% by mass or more, extremely preferably 75% by mass or more, highly preferably 80% by mass or more, even more preferably 85% by mass or more, and further preferably 90% by mass or more, on the basis of the total amount of the first particles and the second particles, from the viewpoint that the polishing rate for an insulating material is further improved. The upper limit of the content of the first particles is preferably 95% by mass or less, more preferably 93% by mass or less, and further preferably 91% by mass or less, on the basis of the total amount of the first particles and the second particles, from the viewpoint that the polishing rate for an insulating material is further improved. From the above-described viewpoints, the content of the first particles is more preferably 50 to 95% by mass on the basis of the total amount of the first particles and the second particles.

The lower limit of the content of the second particles is preferably 5% by mass or more, more preferably 7% by mass or more, and further preferably 9% by mass or more, on the basis of the total amount of the first particles and the second particles, from the viewpoint that the polishing rate for an insulating material is further improved. The upper limit of the content of the second particles is preferably 50% by mass or less, more preferably less than 50% by mass, further preferably 40% by mass or less, particularly preferably 30% by mass or less, extremely preferably 20% by mass or less, and highly preferably 10% by mass or less, on the basis of the total amount of the first particles and the second particles, from the viewpoint that the polishing rate for an insulating material is further improved. From the above-described viewpoints, the content of the second particles is more preferably 5 to 50% by mass on the basis of the total amount of the first particles and the second particles.

The lower limit of the content of the first particles in the slurry is preferably 0.005% by mass or more, more preferably 0.008% by mass or more, further preferably 0.01% by mass or more, particularly preferably 0.05% by mass or more, extremely preferably 0.07% by mass or more, and highly preferably 0.08% by mass or more, on the basis of the total mass of the slurry, from the viewpoint that the polishing rate for an insulating material is further improved. The upper limit of the content of the first particles in the slurry is preferably 5% by mass or less, more preferably 3% by mass or less, further preferably 1% by mass or less, particularly preferably 0.5% by mass or less, extremely preferably 0.3% by mass or less, highly preferably 0.1% by mass or less, even more preferably 0.09% by mass or less, and further preferably 0.085% by mass or less, on the basis of the total mass of the slurry, from the viewpoint that the polishing rate for an insulating material is further improved and the viewpoint of enhancing the storage stability of the slurry. From the above-described viewpoints, the content of the first particles in the slurry is more preferably 0.005 to 5% by mass on the basis of the total mass of the slurry.

The lower limit of the content of the second particles in the slurry is preferably 0.005% by mass or more, more preferably 0.008% by mass or more, further preferably 0.01% by mass or more, particularly preferably 0.012% by mass or more, extremely preferably 0.015% by mass or more, and highly preferably 0.016% by mass or more, on the basis of the total mass of the slurry, from the viewpoint of further enhancing a chemical interaction between the abrasive grains and a surface to be polished so that the polishing rate for an insulating material is further improved. The upper limit of the content of the second particles in the slurry is preferably 5% by mass or less, more preferably 3% by mass or less, further preferably 1% by mass or less, particularly preferably 0.5% by mass or less, extremely preferably 0.1% by mass or less, highly preferably 0.05% by mass or less, even more preferably 0.04% by mass or less, further preferably 0.035% by mass or less, further preferably 0.03% by mass or less, particularly preferably 0.02% by mass or less, and extremely preferably 0.018% by mass or less, on the basis of the total mass of the slurry, from the viewpoints of easily avoiding the aggregation of the abrasive grains, and easily obtaining a more favorable chemical interaction between the abrasive grains and a surface to be polished to easily utilize the properties of the abrasive grains effectively. From the above-described viewpoints, the content of the second particles in the slurry is more preferably 0.005 to 5% by mass on the basis of the total mass of the slurry.

The lower limit of the content of cerium oxide in the slurry is preferably 0.005% by mass or more, more preferably 0.008% by mass or more, further preferably 0.01% by mass or more, particularly preferably 0.05% by mass or more, extremely preferably 0.07% by mass or more, and highly preferably 0.08% by mass or more, on the basis of the total mass of the slurry, from the viewpoint that the polishing rate for an insulating material is further improved. The upper limit of the content of cerium oxide in the slurry is preferably 5% by mass or less, more preferably 3% by mass or less, further preferably 1% by mass or less, particularly preferably 0.5% by mass or less, extremely preferably 0.3% by mass or less, highly preferably 0.1% by mass or less, even more preferably 0.09% by mass or less, and further preferably 0.085% by mass or less, on the basis of the total mass of the slurry, from the viewpoint that the polishing rate for an insulating material is further improved and the viewpoint of enhancing the storage stability of the slurry. From the above-described viewpoints, the content of cerium oxide in the slurry is more preferably 0.005 to 5% by mass on the basis of the total mass of the slurry.

The lower limit of the content of cerium hydroxide in the slurry is preferably 0.005% by mass or more, more preferably 0.008% by mass or more, further preferably 0.01% by mass or more, particularly preferably 0.012% by mass or more, extremely preferably 0.015% by mass or more, and highly preferably 0.016% by mass or more, on the basis of the total mass of the slurry, from the viewpoint of further enhancing a chemical interaction between the abrasive grains and a surface to be polished so that the polishing rate for an insulating material is further improved. The upper limit of the content of cerium hydroxide in the slurry is preferably 5% by mass or less, more preferably 3% by mass or less, further preferably 1% by mass or less, particularly preferably 0.5% by mass or less, extremely preferably 0.1% by mass or less, highly preferably 0.05% by mass or less, even more preferably 0.04% by mass or less, further preferably 0.035% by mass or less, further preferably 0.03% by mass or less, particularly preferably 0.02% by mass or less, and extremely preferably 0.018% by mass or less, on the basis of the total mass of the slurry, from the viewpoints of easily avoiding the aggregation of the abrasive grains, and easily obtaining a more favorable chemical interaction between the abrasive grains and a surface to be polished to easily utilize the properties of the abrasive grains effectively. From the above-described viewpoints, the content of cerium hydroxide in the slurry is more preferably 0.005 to 5% by mass on the basis of the total mass of the slurry.

The lower limit of the content of the abrasive grains in the slurry is preferably 0.01% by mass or more, more preferably 0.05% by mass or more, further preferably 0.08% by mass or more, and particularly preferably 0.1% by mass or more, on the basis of the total mass of the slurry, from the viewpoint that the polishing rate for an insulating material is further improved. The upper limit of the content of the abrasive grains in the slurry is preferably 10% by mass or less, more preferably 5% by mass or less, further preferably 1% by mass or less, particularly preferably 0.5% by mass or less, extremely preferably 0.1% by mass or less, highly preferably 0.2% by mass or less, even more preferably 0.15% by mass or less, further preferably 0.135% by mass or less, and particularly preferably 0.13% by mass or less, on the basis of the total mass of the slurry, from the viewpoint of enhancing the storage stability of the slurry. From the above-described viewpoints, the content of the abrasive grains in the slurry is more preferably 0.01 to 10% by mass on the basis of the total mass of the slurry.

The slurry of the present embodiment may contain particles other than the composite particles including the first particles and the second particles. Examples of such other particles include the first particles not in contact with the second particles; the second particles not in contact with the first particles; and third particles composed of silica, alumina, zirconia, yttria, or the like (particles not including the first particles and the second particles).

(Liquid Medium)

The liquid medium is not particularly limited; however, water such as deionized water or ultrapure water is preferred. The content of the liquid medium may be the balance of the slurry remaining after excluding the contents of other constituent components, and the content is not particularly limited.

(Optional Components)

The slurry of the present embodiment may further contain optional additives. Examples of the optional additives include a material having a carboxyl group (excluding a compound corresponding to a polyoxyalkylene compound or a water-soluble polymer), a polyoxyalkylene compound, a water-soluble polymer, an oxidizing agent (for example, hydrogen peroxide), and a dispersant (for example, a phosphoric acid-based inorganic salt). The respective additives can be used singly or in combination of two or more kinds thereof.

Examples of the material having a carboxyl group include monocarboxylic acids such as acetic acid, propionic acid, butyric acid, and valeric acid; hydroxy acids such as lactic acid, malic acid, and citric acid; dicarboxylic acids such as malonic acid, succinic acid, fumaric acid, and maleic acid; polycarboxylic acids such as polyacrylic acid and polymaleic acid; and amino acids such as arginine, histidine, and lysine.

Examples of the polyoxyalkylene compound include a polyalkylene glycol and a polyoxyalkylene derivative.

Examples of the polyalkylene glycol include polyethylene glycol, polypropylene glycol, and polybutylene glycol. The polyalkylene glycol is preferably at least one selected from the group consisting of polyethylene glycol and polypropylene glycol, and is more preferably polyethylene glycol.

A polyoxyalkylene derivative is, for example, a compound obtained by introducing a functional group or a substituent to a polyalkylene glycol, or a compound obtained by adding a polyalkylene oxide to an organic compound. Examples of the functional group or a substituent include an alkyl ether group, an alkyl phenyl ether group, a phenyl ether group, a styrenated phenyl ether group, a glyceryl ether group, an alkylamine group, a fatty acid ester group, and a glycol ester group. Examples of the polyoxyalkylene derivative include a polyoxyethylene alkyl ether, polyoxyethylene bisphenol ether (for example, manufactured by NIPPON NYUKAZAI CO., LTD., BA GLYCOL series), polyoxyethylene styrenated phenyl ether (for example, manufactured by Kao Corporation, EMULGEN series), a polyoxyethylene alkyl phenyl ether (for example, manufactured by DKS Co. Ltd., NOIGEN EA series), a polyoxyalkylene polyglyceryl ether (for example, manufactured by Sakamoto Yakuhin Kogyo Co., Ltd., SC-E series and SC-P series), a polyoxyethylene sorbitan fatty acid ester (for example, manufactured by DKS Co. Ltd., SORGEN TW series), a polyoxyethylene fatty acid ester (for example, manufactured by Kao Corporation, EMANON series), a polyoxyethylene alkylamine (for example, manufactured by DKS Co. Ltd., AMIRADIN D), and other compounds having a polyalkylene oxide added thereto (for example, manufactured by Nissin Chemical Co., Ltd., SURFINOL 465, and manufactured by NIPPON NYUKAZAI CO., LTD., TMP series).

The "water-soluble polymer" is defined as a polymer which is dissolved in 100 g of water in an amount of 0.1 g or more. A polymer that corresponds to the polyoxyalkylene compound is not to be included in the "water-soluble polymer". The water-soluble polymer is not particularly limited, and examples include acrylic polymers such as polyacrylamide and polydimethylacrylamide; polysaccharides such as carboxymethyl cellulose, agar, curdlan, dextrin, cyclodextrin, and pullulan; vinyl-based polymers such as polyvinyl alcohol, polyvinylpyrrolidone, and polyacrolein; glycerin-based polymers such as polyglycerin and a polyglycerin derivative; and polyethylene glycol.

(Characteristics of Slurry)

The lower limit of the pH of the slurry of the present embodiment is preferably 2.0 or more, more preferably 2.5 or more, further preferably 2.8 or more, particularly preferably 3.0 or more, extremely preferably 3.2 or more, highly preferably 3.5 or more, even more preferably 4.0 or more, and further preferably 4.1 or more, from the viewpoint that the polishing rate for an insulating material is further improved. The upper limit of the pH is preferably 7.0 or less, more preferably 6.5 or less, further preferably 6.0 or less, particularly preferably 5.0 or less, extremely preferably 4.8 or less, highly preferably 4.7 or less, even more preferably 4.6 or less, further preferably 4.5 or less, and particularly preferably 4.4 or less, from the viewpoint that the storage stability of the slurry is further improved. From the above-described viewpoints, the pH is more preferably 2.0 to 7.0. The pH of the slurry is defined as the pH at a liquid temperature of 25° C.

The pH of the slurry can be adjusted by means of an acid component such as an inorganic acid or an organic acid; an alkali component such as ammonia, sodium hydroxide, tetramethylammonium hydroxide (TMAH), imidazole, or an alkanolamine; or the like. Furthermore, a buffering agent may be added in order to stabilize the pH. Furthermore, a buffering agent may be added as a buffer solution (a liquid containing a buffering agent). Examples of such a buffer solution include an acetate buffer solution and a phthalate buffer solution.

The pH of the slurry of the present embodiment can be measured by a pH meter (for example, Model No. PHL-40 manufactured by DKK-TOA CORPORATION). Specifically, for example, a pH meter is subjected to two-point calibration using a phthalate pH buffer solution (pH: 4.01) and a neutral phosphate pH buffer solution (pH: 6.86) as standard buffer solutions, subsequently the electrode of the pH meter is introduced into the slurry, and the value after being stabilized after a lapse of two minutes or longer is measured. The liquid temperatures of the standard buffer solutions and the slurry are all set to 25° C.

In a case where the slurry of the present embodiment is used as a CMP polishing liquid, the constituent components of the polishing liquid may be stored as a one-pack polishing liquid, or may be stored as a multi-pack (for example, two-pack) polishing liquid set in which the constituent components of the polishing liquid are divided into a slurry and an additive liquid such that a slurry (first liquid) containing abrasive grains and a liquid medium, and an additive liquid (second liquid) containing additives and a liquid medium are mixed to form the polishing liquid. The additive liquid may contain, for example, an oxidizing agent. The constituent components of the polishing liquid may be stored as a polishing liquid set while being divided into three or more liquids.

In the polishing liquid set, the slurry and the additive liquid are mixed immediately before polishing or during polishing to prepare the polishing liquid. Furthermore, a one-pack polishing liquid may be stored as a stock solution for a polishing liquid with a reduced liquid medium content and used by dilution with a liquid medium at the time of polishing. A multi-pack polishing liquid set may be stored as a stock solution for a slurry and a stock solution for an additive liquid with reduced liquid medium contents, and used by dilution with a liquid medium at the time of polishing.

<Polishing Method>

The polishing method (such as a polishing method of a base substrate) of the present embodiment includes a polishing step of polishing a surface to be polished (such as a surface to be polished of a base substrate) by using the above-described slurry. The slurry in the polishing step may be a polishing liquid obtained by mixing the slurry and the additive liquid of the above-described polishing liquid set.

In the polishing step, for example, in a state where a material to be polished of the base substrate that has the material to be polished is pressed against a polishing pad (polishing cloth) of a polishing platen, the slurry is supplied between the material to be polished and the polishing pad, and the base substrate and the polishing platen are moved relative to each other to polish the surface to be polished of the material to be polished. In the polishing step, for example, at least a part of a material to be polished is removed by polishing.

As the base substrate that is to be polished, a substrate to be polished or the like is exemplified. As the substrate to be polished, for example, a base substrate in which a material to be polished is formed on a substrate for semiconductor element production (for example, a semiconductor substrate in which an STI pattern, a gate pattern, a wiring pattern, or the like is formed) is exemplified. Examples of the material to be polished include an insulating material such as silicon oxide. The material to be polished may be a single material or a plurality of materials. In a case where a plurality of materials are exposed on a surface to be polished, they can be considered as a material to be polished. The material to be polished may be in the form of a film (film to be polished) and may be an insulating film such as a silicon oxide film.

By polishing a material to be polished (for example, an insulating material such as silicon oxide) formed on such a substrate with the slurry and removing an excess part, it is possible to eliminate irregularities on the surface of a material to be polished and to produce a smooth surface over the entire surface of the polished material.

In the polishing method of the present embodiment, as a polishing apparatus, it is possible to use a common polishing apparatus which has a holder capable of holding a base substrate having a surface to be polished and a polishing platen to which a polishing pad can be pasted. A motor or the like in which the number of rotations can be changed is attached to each of the holder and the polishing platen. As the polishing apparatus, for example, polishing apparatus: F-REX300 manufactured by EBARA CORPORATION, or polishing apparatus: MIRRA manufactured by Applied Materials, Inc. can be used.

As the polishing pad, common unwoven cloth, a foamed body, an unfoamed body, and the like can be used. As the material for the polishing pad, it is possible to use a resin such as polyurethane, an acrylic resin, polyester, an acrylic-ester copolymer, polytetrafluoroethylene, polypropylene, polyethylene, poly-4-methylpentene, cellulose, cellulose ester, polyamide (for example, Nylon (trade name) and aramid), polyimide, polyimidamide, a polysiloxane copolymer, an oxirane compound, a phenolic resin, polystyrene, polycarbonate, or an epoxy resin. Particularly, from the viewpoint of obtaining further excellent polishing rate and flattening properties, the material for the polishing pad is preferably at least one selected from the group consisting of a foamed polyurethane and a non-foamed polyurethane. It is preferable that the polishing pad is subjected to groove processing, by which the slurry accumulates thereon.

Polishing conditions are not limited, but the upper limit of the rotation speed of a polishing platen is preferably 200 min-1 (min-1=rpm) or less such that the base substrate is not let out, and the upper limit of the polishing pressure to be applied to the base substrate (processing load) is preferably 100 kPa or less from the viewpoint of easily suppressing the generation of polishing scratches. The slurry is preferably continuously supplied to the polishing pad with a pump or the like during polishing. There are no limitations on the supply amount for this, however, it is preferable that the surface of the polishing pad is always covered with the slurry.

The present embodiment is preferably used for polishing a surface to be polished containing silicon oxide. According to the present embodiment, it is possible to provide use of a slurry in polishing of a surface to be polished containing silicon oxide. The present embodiment can be suitably used in formation of an STI and polishing of an interlayer insulating material at a high rate. The lower limit of the polishing rate for an insulating material (for example, silicon oxide) is preferably 850 nm/min or more, more preferably 900 nm/min or more, and further preferably 1000 nm/min or more.

The present embodiment can also be used in polishing of a pre-metal insulating material. Examples of the pre-metal insulating material include silicon oxide, phosphorus-silicate glass, boron-phosphorus-silicate glass, silicon oxyfluoride, and fluorinated amorphous carbon.

The present embodiment can also be applied to materials other than the insulating material such as silicon oxide. Examples of such a material include high permittivity materials such as Hf-based, Ti-based, and Ta-based oxides; semiconductor materials such as silicon, amorphous silicon, SiC, SiGe, Ge, GaN, GaP, GaAs, and organic semiconductors; phase-change materials such as GeSbTe; inorganic electroconductive materials such as ITO; and polymer resin materials such as polyimide-based, polybenzooxazole-based, acrylic, epoxy-based, and phenol-based materials.

The present embodiment can be applied not only to film-like objects to be polished, but also to various types of substrates made of glass, silicon, SiC, SiGe, Ge, GaN, GaP, GaAs, sapphire, plastics, or the like.

The present embodiment can be used not only for the production of semiconductor elements, but also for the production of image display devices such as TFT or organic EL; optical components such as a photomask, a lens, a prism, an optical fiber, or a single crystal scintillator; optical elements such as an optical switching element or an optical waveguide; light-emitting elements such as a solid laser or a blue laser LED; and magnetic storage devices such as a magnetic disc or a magnetic head.

EXAMPLES

Hereinafter, the present invention will be specifically described based on Examples; however, the present invention is not limited to the following Examples.

<Preparation of Cerium Oxide Slurry>

Particles containing cerium oxide (first particles; hereinafter, referred to as "cerium oxide particles") and trade name: ammonium dihydrogen phosphate manufactured by Wako Pure Chemical Industries, Ltd. (molecular weight: 97.99) were mixed to prepare a cerium oxide slurry (pH: 7) containing 5.0% by mass (solid content amount) of the cerium oxide particles. The mixing amount of the ammonium dihydrogen phosphate was adjusted to 1% by mass on the basis of the total amount of the cerium oxide particles.

An adequate amount of the cerium oxide slurry was introduced into trade name: MICROTRAC MT3300EXII manufactured by MicrotracBEL Corp., and the average particle size of the cerium oxide particles was measured. The displayed average particle size value was obtained as the average particle size (average secondary particle size). The average particle size of the cerium oxide particles in the cerium oxide slurry was 145 nm.

An adequate amount of the cerium oxide slurry was introduced into trade name: DelsaNano C manufactured by Beckman Coulter, Inc. and measurement was performed twice at 25° C. The average value of the displayed zeta potentials was obtained as the zeta potential. The zeta potential of the cerium oxide particles in the cerium oxide slurry was −55 mV.

<Preparation of Cerium Hydroxide Slurry>

(Synthesis of Cerium Hydroxide)

480 g of an aqueous 50% by mass $Ce(NH_4)_2(NO_3)_6$ solution (trade name: CAN50 liquid manufactured by Nihon Kagaku Sangyo Co., Ltd.) was mixed with 7450 g of pure water to obtain a solution. Next, while this solution was stirred, 750 g of an aqueous solution of imidazole (10% by mass aqueous solution, 1.47 mol/L) was added dropwise thereto at a mixing rate of 5 mL/min, and thereby a precipitate containing cerium hydroxide was obtained. The cerium hydroxide was synthesized at a temperature of 20° C. and a stirring speed of 500 min-1. The stirring was performed using a 3-blade pitch paddle with a total blade section length of 5 cm.

The obtained precipitate (precipitate containing cerium hydroxide) was subjected to centrifugal separation (4000 min-1, for 5 minutes), and then subjected to solid-liquid separation with removal of a liquid phase by decantation. 10 g of the particles obtained by solid-liquid separation were mixed with 990 g of water, and then the particles were dispersed in water using an ultrasonic cleaner, thereby preparing a cerium hydroxide slurry (content of particles: 1.0% by mass) containing particles that contained cerium hydroxide (second particles; hereinafter, referred to as "cerium hydroxide particles").

(Measurement of Average Particle Size)

When the average particle size (average secondary particle size) of the cerium hydroxide particles in the cerium hydroxide slurry was measured using trade name: N5 manufactured by Beckman Coulter, Inc., a value of 10 nm was obtained. The measuring method was as follows. First, about 1 mL of a measuring sample (cerium hydroxide slurry, aqueous dispersion liquid) containing 1.0% by mass of cerium hydroxide particles was introduced into a 1-cm square cell, and then the cell was placed in the N5. Measurement was performed at 25° C. with the refractive index set to 1.333 and the viscosity set to 0.887 mPa·s as the measuring sample information of N5 software, and the value displayed as Unimodal Size Mean was read off.

(Measurement of Zeta Potential)

An adequate amount of the cerium hydroxide slurry was introduced into trade name: DelsaNano C manufactured by Beckman Coulter, Inc. and measurement was performed twice at 25° C. The average value of the displayed zeta potentials was obtained as the zeta potential. The zeta potential of the cerium hydroxide particles in the cerium hydroxide slurry was +50 mV.

(Structural Analysis of Cerium Hydroxide Particles)

An adequate amount of the cerium hydroxide slurry was taken and vacuum-dried to isolate the cerium hydroxide particles, and then sufficiently washed with pure water to obtain a sample. When the obtained sample was measured by FT-IR ATR method, a peak based on nitrate ion ($NO_3$) was observed in addition to a peak based on hydroxide ion (OH). Furthermore, when the same sample was measured by XPS (N-XPS) for nitrogen, a peak based on nitrate ion was observed while no peak based on $NH_4^+$ was observed. These results confirmed that the cerium hydroxide particles at least partially contained particles having nitrate ion bonded to a cerium element. Furthermore, since particles having hydroxide ion bonded to a cerium element were at least partially contained in the cerium hydroxide particles, it was confirmed that the cerium hydroxide particles contained cerium hydroxide. These results confirmed that the cerium hydroxide contained a hydroxide ion bonded to a cerium element.

<Preparation of Slurry>

Example 1

While stirring at a rotation speed of 300 rpm using a stirring blade of two blades, 25 g of the cerium hydroxide slurry and 1935 g of ion-exchange water were mixed to obtain a mixed liquid. Subsequently, after mixing 40 g of the cerium oxide slurry in the mixed liquid while stirring the mixed liquid, stirring was performed while being irradiated with ultrasonic waves using an ultrasonic cleaner (device name: US-105) manufactured by SND Co., Ltd. Thereby, a test slurry containing composite particles including cerium oxide particles and cerium hydroxide particles that were in contact with the cerium oxide particles (content of cerium oxide particles: 0.1% by mass, content of cerium hydroxide particles: 0.0125% by mass) was prepared.

Example 2

While stirring at a rotation speed of 300 rpm using a stirring blade of two blades, 30 g of the cerium hydroxide slurry and 1930 g of ion-exchange water were mixed to obtain a mixed liquid. Subsequently, after mixing 40 g of the cerium oxide slurry in the mixed liquid while stirring the mixed liquid, stirring was performed while being irradiated with ultrasonic waves using an ultrasonic cleaner (device name: US-105) manufactured by SND Co., Ltd. Thereby, a test slurry containing cerium hydroxide particles (free particles) that were not in contact with cerium oxide particles in addition to composite particles including cerium oxide particles and cerium hydroxide particles that were in contact with the cerium oxide particles (content of cerium oxide particles: 0.1% by mass, content of cerium hydroxide particles: 0.015% by mass) was prepared.

Example 3

While stirring at a rotation speed of 300 rpm using a stirring blade of two blades, 35 g of the cerium hydroxide slurry and 1925 g of ion-exchange water were mixed to obtain a mixed liquid. Subsequently, after mixing 40 g of the cerium oxide slurry in the mixed liquid while stirring the mixed liquid, stirring was performed while being irradiated with ultrasonic waves using an ultrasonic cleaner (device name: US-105) manufactured by SND Co., Ltd. Thereby, a test slurry containing cerium hydroxide particles (free particles) that were not in contact with cerium oxide particles in addition to composite particles including cerium oxide particles and cerium hydroxide particles that were in contact with the cerium oxide particles (content of cerium oxide particles: 0.1% by mass, content of cerium hydroxide particles: 0.0175% by mass) was prepared.

Example 4

While stirring at a rotation speed of 300 rpm using a stirring blade of two blades, 40 g of the cerium hydroxide slurry and 1920 g of ion-exchange water were mixed to obtain a mixed liquid. Subsequently, after mixing 40 g of the cerium oxide slurry in the mixed liquid while stirring the mixed liquid, stirring was performed while being irradiated with ultrasonic waves using an ultrasonic cleaner (device name: US-105) manufactured by SND Co., Ltd. Thereby, a test slurry containing cerium hydroxide particles (free particles) that were not in contact with cerium oxide particles in addition to composite particles including cerium oxide particles and cerium hydroxide particles that were in contact with the cerium oxide particles (content of cerium oxide particles: 0.1% by mass, content of cerium hydroxide particles: 0.02% by mass) was prepared.

Comparative Example 1

After mixing 40 g of the cerium oxide slurry and 1960 g of ion-exchange water while stirring at a rotation speed of 300 rpm using a stirring blade of two blades, stirring was performed while being irradiated with ultrasonic waves using an ultrasonic cleaner (device name: US-105) manufactured by SND Co., Ltd. Thereby, a test slurry containing cerium oxide particles (content of cerium oxide particles: 0.1% by mass) was prepared.

Comparative Example 2

After mixing 200 g of the cerium hydroxide slurry and 1800 g of ion-exchange water while stirring at a rotation speed of 300 rpm using a stirring blade of two blades, stirring was performed while being irradiated with ultrasonic waves using an ultrasonic cleaner (device name: US-105) manufactured by SND Co., Ltd. Thereby, a test slurry containing cerium hydroxide particles (content of cerium hydroxide particles: 0.1% by mass) was prepared.

<Measurement of Valence>

The test slurry was treated for 30 minutes at a centrifugal acceleration of 1.1×10+G by using a centrifugal separator (trade name: Optima MAX-TL) manufactured by Beckman Coulter, Inc. so as to separate the solid phase and the liquid phase (supernatant solution). After the liquid phase was removed, the solid phase was vacuum-dried at 25° C. for 24 hours, and thereby a measurement sample was obtained. The valence of cerium contained in the abrasive grains in this measurement sample was measured by X-ray photoelectron spectroscopy.

As the measuring apparatus of the X-ray photoelectron spectroscopy (XPS), trade name "K-Alpha" manufactured by Thermo Fisher Scientific Inc. was used. The measurement conditions are as follows.

[XPS Conditions]

Pass energy: 100 eV

Cumulated number: 10 times

Bonding energy: Range of 870 to 930 eV

Excited X-ray: monochromatic Al Kα1,2 radiation (1486.6 eV)

X-ray diameter: 200 μm

Photoelectron escape angle: 45°

Next, regarding the valence of cerium, a waveform due to trivalent and a waveform due to tetravalent were separated by using analysis software supplied with the apparatus. The waveform separation was performed according to the method described in literature "Surface Science vol. 563 (2004) p. 74-82". Then, the ratio of trivalent was obtained on the basis of formula below. The measurement results are shown in Table 1.

Ratio of trivalent=(Trivalent amount [at %]/(Trivalent amount [at %]+Tetravalent amount [at %])

<Measurement of pH>

The pH of the test slurry was measured using Model No. PHL-40 manufactured by DKK-TOA CORPORATION. The measurement results are shown in Table 1.

<Measurement of Zeta Potential of Abrasive Grains>

An adequate amount of the test slurry was introduced into trade name "DelsaNano C" manufactured by Beckman Coulter, Inc. The measurement was performed at 25° C. twice, and the average value of the displayed zeta potentials was adopted. The measurement results are shown in Table 1.

<Measurement of Average Particle Size of Abrasive Grains>

Each of the test slurries of Examples 1 to 4 and Comparative Example 1 was introduced in an adequate amount into trade name: MICROTRAC MT3300EXII manufactured by MicrotracBEL Corp., and measurement of the average particle size of the abrasive grains was performed. Furthermore, the test slurry of Comparative Example 2 was introduced in an adequate amount into trade name: N5 manufactured by Beckman Coulter, Inc., and measurement of the average particle size of the abrasive grains was performed. The displayed each average particle size value was obtained as the average particle size (average secondary particle size) of the abrasive grains. The measurement results are shown in Table 1.

<Measurement of Polishing Rate>

The content of the abrasive grains (the total amount of particles) in the test slurry was adjusted to 0.1% by mass (diluted with ion-exchange water) to prepare a CMP polishing liquid. The substrate to be polished was polished by using this CMP polishing liquid under the polishing conditions below. Values of the valence and the pH in the CMP polishing liquid and the zeta potential and the average particle size of the abrasive grains were the same as the values in the test slurry mentioned above.

[CMP Polishing Conditions]

Polishing apparatus: MIRRA (manufactured by Applied Materials, Inc.)

Flow rate of CMP polishing liquid: 200 mL/min

Substrate to be polished: As a blanket wafer having no pattern formed thereon, a substrate to be polished having a silicon oxide film having a thickness of 2 μm, which had been formed by a plasma CVD method, on a silicon substrate was used.

Polishing pad: Foamed polyurethane resin having closed pores (manufactured by Dow Chemical Japan Ltd., Product No.: IC1010) Polishing pressure: 13 kPa (2.0 psi)

Rotation numbers of substrate to be polished and polishing platen: Substrate to be polished/polishing platen=93/87 rpm Polishing time: 1 minute Washing of wafer: After a CMP treatment, washing was performed with water while applying an ultrasonic wave, and then drying was performed with a spin dryer.

The polishing rate for a silicon oxide film ($SiO_2$RR) that had been polished and washed under the above-described conditions was obtained by the formula below. The measurement results are shown in Table 1. The film thickness difference of the silicon oxide film before and after polishing was obtained using a light interference type film thickness measuring apparatus (trade name: F80 manufactured by Filmetrics Japan, Inc.).

Polishing rate (RR)=(Film thickness difference [nm] of silicon oxide film before and after polishing)/(Polishing time: 1 [min])

TABLE 1

| | Ratio of trivalent | pH | Zeta potential [mV] | Average particle size [nm] | Polishing rate [nm/min] |
|---|---|---|---|---|---|
| Example 1 | 0.17 | 3.9 | 55 | 155 | 360 |
| Example 2 | 0.20 | 3.9 | 52 | 155 | 401 |
| Example 3 | 0.17 | 4.0 | 52 | 155 | 450 |
| Example 4 | 0.16 | 4.1 | 50 | 155 | 456 |
| Comparative Example 1 | 0.05 | 7.0 | −62 | 145 | 245 |
| Comparative Example 2 | 0.04 | 4.0 | 50 | 10 | 28 |

The invention claimed is:

1. A slurry comprising abrasive grains and a liquid medium, wherein
   the abrasive grains include first particles and second particles in contact with the first particles,
   the second particles contain at least one metal compound selected from the group consisting of a metal oxide and a metal hydroxide,
   the at least one the metal compound contains a metal capable of taking a plurality of valences, and
   a ratio of an atomic amount of the metal having the lowest valence of the plurality of valences to a total atomic amount of the metal is 0.10 or more in X-ray photoelectron spectroscopy.

2. The slurry according to claim 1, wherein the lowest valence is trivalent.

3. The slurry according to claim 1, wherein the metal contains a rare-earth metal.

4. The slurry according to claim 1, wherein the metal contains cerium.

5. The slurry according to claim 1, wherein the first particles contain at least one selected from the group consisting of silicon, vanadium, manganese, iron, cobalt, nickel, copper, silver, indium, tin, a rare earth element, tungsten, and bismuth.

6. The slurry according to claim 1, wherein the first particles contain cerium oxide.

7. The slurry according to claim 1, wherein a zeta potential of the abrasive grains is +10 mV or more.

8. A polishing method comprising a step of polishing a surface to be polished by using the slurry according to claim 1.

9. The slurry according to claim 1, wherein the first particles contain cerium oxide.

10. The slurry according to claim 1, wherein the second particles contain the metal hydroxide.

11. The slurry according to claim 9, wherein the second particles contain the metal hydroxide.

12. The slurry according to claim 1, wherein the second particles contain cerium hydroxide.

13. The slurry according to claim 9, wherein the second particles contain cerium hydroxide.

14. The slurry according to claim 1, wherein a particle size of the second particles is smaller than a particle size of the first particles.

15. The slurry according to claim 1, wherein a particle size of the first particles is 15 to 1000 nm.

16. The slurry according to claim 1, wherein a particle size of the second particles is 1 to 50 nm.

17. The slurry according to claim 1, wherein a content of cerium hydroxide in the abrasive grains is 5 to 50% by mass on the basis of the entire abrasive grains.

18. The slurry according to claim 1, wherein a content of the abrasive grains is 0.01 to 1% by mass on the basis of the total mass of the slurry.

19. The slurry according to claim 1, wherein pH is 2.0 to 5.0.

20. The polishing method according to claim 8, wherein the surface to be polished contains silicon oxide.

21. The slurry according to claim 1, wherein:
the second particles contain at least one cerium compound selected from the group consisting of cerium oxide and cerium hydroxide,
the at least one cerium compound contains cerium capable of being trivalent cerium or tetravalent cerium, and
a ratio of an atomic amount of the trivalent cerium to a total atomic amount of the trivalent cerium and the tetravalent cerium is 0.10 or more in X-ray photoelectron spectroscopy.

* * * * *